United States Patent
Kim

(10) Patent No.: US 7,825,504 B2
(45) Date of Patent: Nov. 2, 2010

(54) SEMICONDUCTOR PACKAGE AND MULTI-CHIP SEMICONDUCTOR PACKAGE USING THE SAME

(75) Inventor: Jae Myun Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 476 days.

(21) Appl. No.: 11/852,425

(22) Filed: Sep. 10, 2007

(65) Prior Publication Data
US 2009/0001542 A1    Jan. 1, 2009

(30) Foreign Application Priority Data
Jun. 26, 2007    (KR) .................. 10-2007-0063252

(51) Int. Cl.
*H01L 23/48* (2006.01)
*H01L 23/52* (2006.01)

(52) U.S. Cl. ................ 257/686; 257/777; 257/773; 257/786; 257/E23.141

(58) Field of Classification Search ................ 257/773, 257/786, 777, 686, E23.141
See application file for complete search history.

(56) References Cited

U.S. PATENT DOCUMENTS 6,696,765 B2 * 2/2004 Kazama et al. ............. 257/779
6,969,908 B2 * 11/2005 Yamaguchi ................. 257/734
7,132,742 B2 * 11/2006 Yamaguchi ................. 257/700
7,298,042 B2 * 11/2007 Yamaguchi ................. 257/700
2004/0124520 A1 * 7/2004 Rinne ........................ 257/686
2006/0001156 A1 * 1/2006 Wakiyama et al. .......... 257/737
2007/0018336 A1 * 1/2007 Farnworth et al. .......... 257/782
2007/0029673 A1 * 2/2007 Yamaguchi ................. 257/737
2007/0102800 A1 * 5/2007 Kang ......................... 257/686
2007/0222054 A1 * 9/2007 Hembree .................... 257/686
2008/0001276 A1 * 1/2008 Lee et al. .................... 257/686

FOREIGN PATENT DOCUMENTS

| KR | 20010063236 | 7/2001 |
|---|---|---|
| KR | 20020030891 | 4/2002 |
| KR | 1020040092304 A | 11/2004 |

* cited by examiner

*Primary Examiner*—Nitin Parekh
(74) *Attorney, Agent, or Firm*—Ladas & Parry LLP

(57) ABSTRACT

Disclosed is a semiconductor package and a multi-chip semiconductor package. The semiconductor package includes a semiconductor chip having bonding pads located at a center portion thereof; redistribution patterns extending from the bonding pads toward one edge of the semiconductor chip; and dummy bump pads located adjacent to another edge of the semiconductor chip which is opposite the one edge.

16 Claims, 5 Drawing Sheets

SEMICONDUCTOR PACKAGE AND MULTI-CHIP SEMICONDUCTOR PACKAGE USING THE SAME

CROSS-REFERENCE TO RELATED APPLICATIONS

The present application claims priority to Korean patent application number 10-2007-0063252 filed on Jun. 29, 2007, which is incorporated herein by reference in its entirety.

BACKGROUND OF THE INVENTION

The present invention relates to a semiconductor package and a multi-chip semiconductor package using the same.

These days, semiconductor devices capable of storing a large amount of data and processing stored data in a short period have been developed. Semiconductor packages having semiconductor devices are being applied to personal computers, television receivers, electric home appliances, information communication equipment, and so forth.

In general, semiconductor packages are manufactured through a semiconductor chip manufacturing process in which semiconductor chips are formed by integrating transistors, resistors, capacitors, etc. into a semiconductor wafer. Then, a packaging process occurs in which the semiconductor chips are individually separated from the wafer and are electrically connected with outside circuit boards and packaged such that the highly brittle semiconductor chips can be protected from externally applied shocks and vibrations.

Recently, as electronic appliances are miniaturized, semiconductor packages are required to have a high degree of integration and multi-functionality. In order to meet these requirements, a multi-chip package has been disclosed in the art in which a plurality of semiconductor chips capable of performing various functions are stacked upon one another.

In a multi-chip semiconductor package according to conventional art, a lower semiconductor chip, which has bonding pads, is located on a substrate, which has an opening defined at the center portion thereof, such that the bonding pads of the lower semiconductor chip are exposed through the opening of the substrate. The bonding pads of the lower semiconductor chip and the connection pads formed on the substrate are bonded with each other by using first conductive wires.

An adhesive member is located on the upper surface of the lower semiconductor chip. An upper semiconductor chip, which has bonding pads located on the upper surface thereof, is located on the adhesive member. The bonding pads of the upper semiconductor chip are bonded with the connection pads formed on the substrate by using second conductive wires.

However, in the conventional multi-chip package, while the first conductive wires, which electrically connect the bonding pads of the lower semiconductor chip and the connection pads of the substrate with each other, have a short length, the second conductive wires, which electrically connect the bonding pads of the upper semiconductor chip and the connection pads of the substrate with each other, have a long length. Accordingly, the conventional multi-chip semiconductor package suffers from defects in that, when processing signals, signal delay and noise generation is caused. Additionally, when processing signals at a high speed, misoperation of the multi-chip package can occur.

SUMMARY OF THE INVENTION

An embodiment of the present invention is directed to a semiconductor package, which prevents signal delay and noise generation, to be adapted for a multi-chip semiconductor package.

Another embodiment of the present invention is directed to a multi-chip semiconductor package which prevents signal delay and noise generation.

In one aspect of the present invention, a semiconductor package comprises a semiconductor chip having bonding pads located at a center portion thereof; redistribution patterns extending from the bonding pads toward one edge of the semiconductor chip; and dummy bump pads located adjacent to another edge of the semiconductor chip which is opposite the one edge.

The redistribution patterns have the shape of a line when viewed from the top, and the dummy bump pads have the shape of an island when viewed from the top.

A first insulation layer pattern is interposed between the semiconductor chip and the redistribution patterns in such a way as to expose the bonding pads.

A second insulation layer pattern is located on the first insulation layer pattern and exposes the dummy bump pads and ends of the redistribution patterns to define bump pads.

Conductive balls are selectively connected to the bump pads.

Conductive balls are connected to the dummy bump pads and the bump pads.

The dummy bump pads and the bump pads are located to be symmetrical with respect to the bonding pads.

An adhesive member is located on the other surface of the semiconductor chip which faces away from one surface of the semiconductor chip on which the bonding pads are formed.

In another aspect of the present invention, a multi-chip semiconductor package comprises first, second and third semiconductor packages each including a semiconductor chip having bonding pads located at a center portion thereof, redistribution patterns extending from the bonding pads toward one edge of the semiconductor chip and having bump pads on ends thereof, and dummy bump pads located adjacent to an opposite edge of the semiconductor chip; a substrate having first connection pads which are electrically connected with the bump pads and the dummy bump pads of the first semiconductor package; a first connection substrate electrically connecting the bump pads of the second semiconductor package located on the first semiconductor package with second connection pads of the substrate; and a second connection substrate electrically connecting the bump pads of the third semiconductor package with third connection pads of the substrate.

Adhesive members are respectively interposed between the first through third semiconductor packages.

The bump pads and the dummy bump pads of the first semiconductor package and the first connection pads of the substrate are electrically connected with each other by way of conductive balls.

The first connection substrate comprises an insulation body; connection wirings for electrically connecting upper and lower surfaces of the insulation body; and conductive balls connected to at least one of upper and lower surfaces of the respective connection wirings.

The second connection substrate comprises an insulation body; connection wirings for electrically connecting upper and lower surfaces of the insulation body; and conductive balls connected to at least one of upper and lower surfaces of the respective connection wirings.

The thickness of the second connection substrate is greater than that of the first connection substrate.

The thickness of the second connection substrate is the same as that of the first connection substrate, and at least two connection substrates are stacked between the substrate and the third semiconductor package.

The second and third semiconductor packages are located on the first semiconductor package in a zigzag type such that the bump pads of the second and third semiconductor packages are exposed out of the first semiconductor package.

DESCRIPTION OF SPECIFIC EMBODIMENTS

Figure 1:
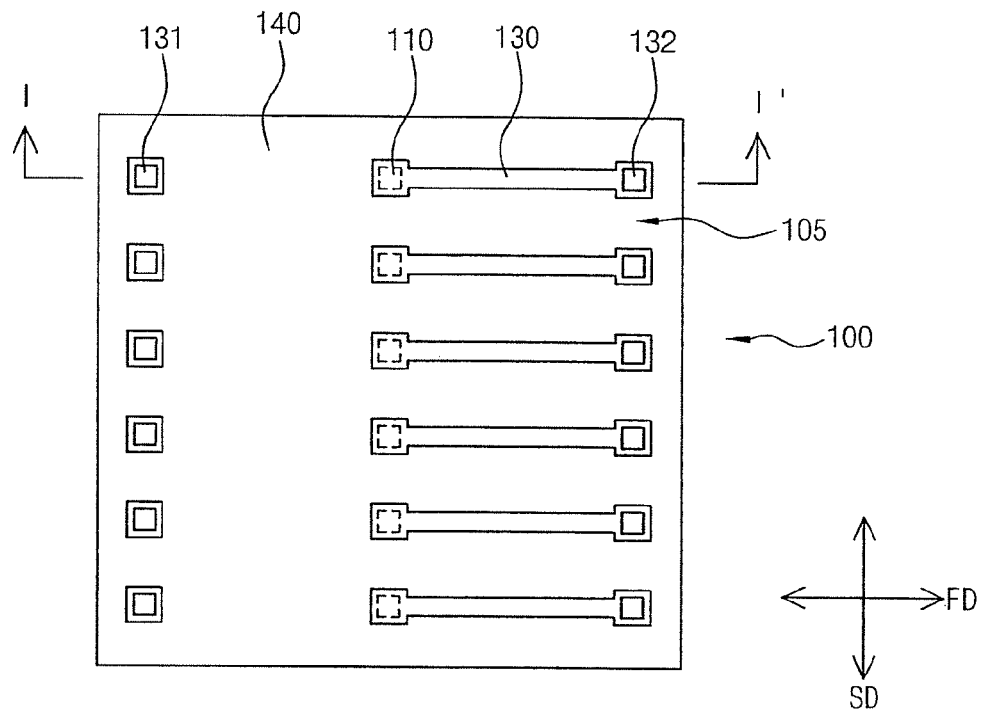
FIG. 1 is a plan view illustrating a semiconductor package in accordance with a first embodiment of the present invention.
Figure 2:
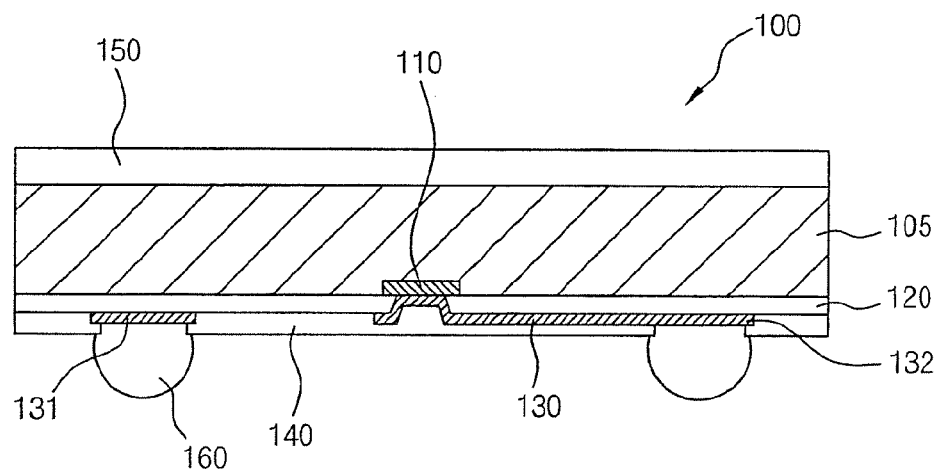
FIG. 2 is a cross-sectional view taken along the line I-I' of FIG. 1, illustrating the semiconductor package with conductive balls attached thereto.

FIG. 1 is a plan view illustrating a semiconductor package in accordance with a first embodiment of the present invention, and FIG. 2 is a cross-sectional view taken along the line I-I' of FIG. 1, illustrating the semiconductor package with conductive balls attached thereto.

Referring to FIGS. 1 and 2, a semiconductor package 100 includes a semiconductor chip 105, redistribution patterns 130, and dummy bump pads 131.

The semiconductor chip 105 has a data storage section (not shown) for storing data, a data processing section (not shown) for processing data, and one or more bonding pads 110 through which data is inputted and outputted.

The respective bonding pads 110 are located, for example, on the center portion of one surface of the semiconductor chip 105. The bonding pads 110 are located along a second direction 'SD' which is perpendicular to a first direction 'FD' in FIG. 1.

The respective bonding pads 110 are electrically connected with the data storage section and/or the data processing section of the semiconductor chip 105.

The redistribution patterns 130 are located on one surface of the semiconductor chip 105 on which the bonding pads 110 are formed.

Referring to FIG. 1, the first ends of the redistribution patterns 130 are electrically connected with the bonding pads 110 which are formed on the semiconductor chip 105, and the second ends of the redistribution patterns 130, which are opposite the first ends, extend toward one edge of the semiconductor chip 105 along the first direction 'FD' in FIG. 1.

The dummy bump pads 131 are located on one surface of the semiconductor chip 105 on which the redistribution patterns 130 are formed. For example, the dummy bump pads 131 have the shape of an island, and thus, are not electrically connected with the data storage section and/or the data processing section. For example, the dummy bump pads 131 are formed to have the number that corresponds to that of the redistribution patterns 130.

Meanwhile, the semiconductor package 100 according to the present embodiment may further include a first insulation layer pattern 120 and a second insulation layer pattern 140.

For example, the first insulation layer pattern 120 is interposed between one surface of the semiconductor chip 105 on which the bonding pads 110 are formed and the redistribution patterns 130. The first insulation layer pattern 120 has openings for exposing the bonding pads 110 to allow the redistribution patterns 130 to be electrically connected with the bonding pads 110.

For example, the second insulation layer pattern 140 is located on one surface of the semiconductor chip 105 on which the bonding pads 110 are formed. The second insulation layer pattern 140 has openings for exposing the dummy bump pads 131 and the ends of the redistribution patterns 130. Hereinafter, the ends of the redistribution patterns 130, which are exposed through the second insulation layer pattern 140, will be referred to as bump pads 132.

The bump pads 132 which are defined by the second insulation layer pattern 140 and the dummy bump pads 131 are located to be symmetrical with respect to the bonding pads 110.

Meanwhile, conductive balls 160 such as solder balls can be connected to the bump pads 132 which are defined by the second insulation layer pattern 140 and the dummy bump pads 131. Alternatively, it can be envisaged that the conductive balls 160 such as solder balls are not connected to the dummy bump pads 131, but selectively connected to the bump pads 132.

An adhesive member 150 is located on the other surface of the semiconductor chip 105 which faces away from the one surface on which the bonding pads 110 are formed. The adhesive member 150 may comprise a double-sided adhesive tape, an adhesive, and the like.

Hereafter, a method for manufacturing a semiconductor package will be described.

Figure 3:
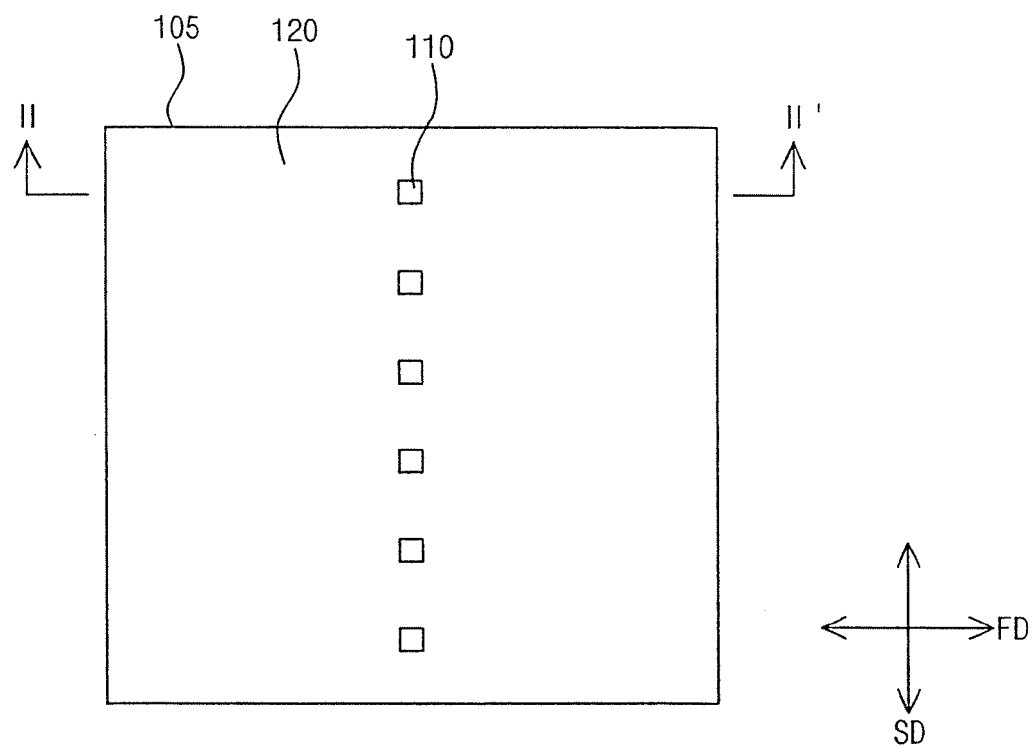
FIG. 3 is a plan view illustrating the semiconductor chip of the semiconductor package.

FIG. 3 is a plan view illustrating the semiconductor chip of a semiconductor package.

Referring to FIG. 3, a semiconductor chip 105 is prepared to manufacture a semiconductor package.

In order to manufacture the semiconductor chip 105, after a data storage section (not shown) for storing data and a data processing section (not shown) for processing data are formed employing various thin film processes, bonding pads 110, which are electrically connected with the data storage section and/or the data processing section, are formed.

After the bonding pads 110 are formed, as can be readily seen from FIGS. 1 and 2, a first insulation layer, which is made of a nitride layer and/or an oxide layer, is formed on one surface of the semiconductor chip 105 on which the bonding pads 110 are formed. The first insulation layer can be formed through a chemical vapor deposition process.

After the first insulation layer is formed, a photoresist film (not shown) is formed on the first insulation layer. By patterning the photoresist film through a photo process including an exposure process and a development process, a photoresist pattern (not shown) is formed on the first insulation layer such that the photoresist pattern has openings which expose the portions of the first insulation layer which correspond to the bonding pads 110.

By etching the first insulation layer using the photoresist pattern as an etch mask, a first insulation layer pattern 120, which exposes the bonding pads 110, is formed.

After the first insulation layer pattern 120 is formed, a metal layer (not shown) is formed on the overall area of the first insulation layer pattern 120. In the present embodiment, the metal layer can be formed through a chemical vapor deposition process or a sputtering process.

After the metal layer is formed, a photoresist film is again formed on the metal layer. By patterning the photoresist film through a photo process including an exposure process and a development process, first photoresist patterns, which extend in the shape of a line toward the bonding pads 110 and one edge of the semiconductor chip 105, are formed. In addition, second photoresist patterns, which have the shape of an island, are formed adjacent to another edge of the semiconductor chip 105 which is opposite the one edge of the semiconductor chip 105.

After the first photoresist patterns and the second photoresist patterns are formed on the metal layer, by etching the metal layer using the first and second photoresist patterns as etch masks, redistribution patterns 130 and dummy bump pads 131 are simultaneously formed on the first insulation layer pattern 120.

After the redistribution patterns 130 and the dummy bump pads 131 are formed, the first and second photoresist patterns are removed from the redistribution patterns 130 and the dummy bump pads 131 through an ashing process and/or a strip process.

After formation of the redistribution patterns 130 and the dummy bump pads 131 is completed, a second insulation layer is formed to cover the first insulation layer pattern 120.

The second insulation layer may comprise an organic layer containing photosensitive substance. Alternatively, the second insulation layer may comprise a nitride layer and/or an oxide layer.

After the second insulation layer is formed, a photoresist film is formed on the second insulation layer. By patterning the photoresist film through a photo process, a photoresist pattern (not shown) is formed on the second insulation layer such that the photoresist pattern has openings which expose ends of the redistribution patterns 130 and the dummy bump pads 131.

By etching the second insulation layer using the photoresist pattern as an etch mask, a second insulation layer pattern 140 having openings, which expose the ends of the redistribution patterns 130 and the dummy bump pads 131, is formed.

Alternatively, in the case that the second insulation layer comprises an organic layer containing photosensitive substance, the organic layer is etched by a photo process without using a photoresist patterning process.

Hereinafter, the ends of the redistribution patterns 130, which are exposed through the second insulation layer pattern 140, will be referred to as bump pads and will be designated by the reference numeral 132.

After the second insulation layer pattern 140 is formed, conductive balls 160 such as solder balls can be connected to the exposed bump pads 132. In the present embodiment, conductive balls 160 are physically connected to the dummy bump pads 131.

Meanwhile, an adhesive member 150 can be attached to the other surface of the semiconductor chip 105 which faces away from the one surface on which the bonding pads 110 are formed.

Figure 4:
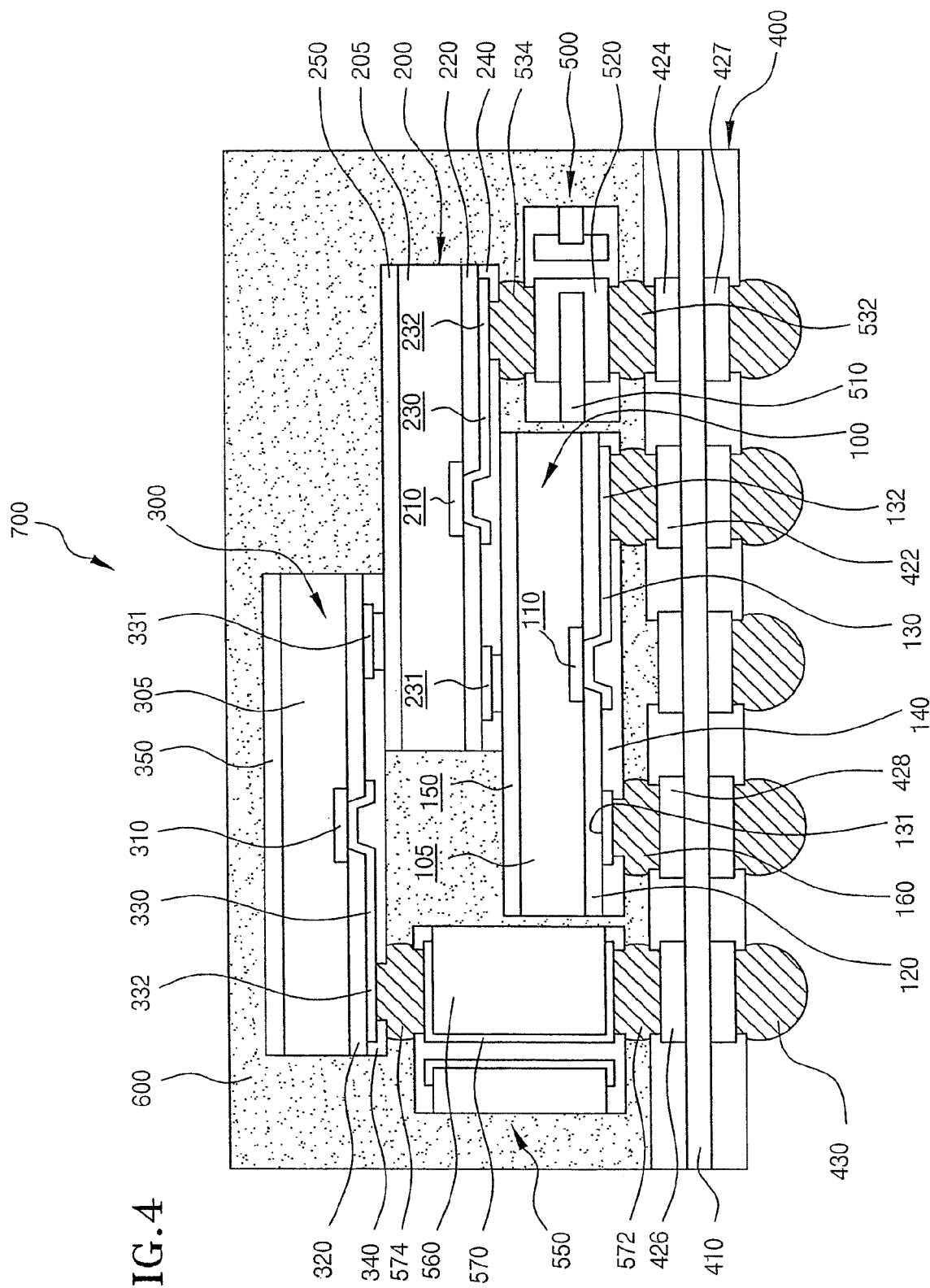
FIG. 4 is a cross-sectional view illustrating a multi-chip semiconductor package in accordance with a second embodiment of the present invention.

FIG. 4 is a cross-sectional view illustrating a multi-chip semiconductor package in accordance with a second embodiment of the present invention.

Referring to FIG. 4, a multi-chip semiconductor package 700 includes semiconductor packages 100, 200 and 300, a substrate 400, a first connection substrate 500, and a second connection substrate 550. In addition, the multi-chip semiconductor package 700 may further include a molding member 600.

The substrate 400 includes an insulation substrate 410, upper connection pads 422, 424 and 426, lower connection pads 427, and conductive balls 430.

The upper connection pads 422, 424 and 426 are located on the upper surface of the insulation substrate 410. Hereafter, the respective connection pads 422, 424 and 426 will be referred to as first connection pads 422, second connection pads 424 and third connection pads 426. In addition, dummy connection pads 428 can be further formed adjacent to the first connection pads 422 among the upper connection pads 422, 424 and 426.

The first connection pads 422 are located on the center portion of the substrate 400, and the second connection pads 424 and the third connection pads 426 are located in the vicinity of the first connection pads 422.

The lower connection pads 427 are located on the lower surface of the insulation substrate 410 which faces away from the upper surface, and the conductive balls 430 are electrically connected to the lower connection pads 427. In the present embodiment, the lower connection pads 427 can be connected with the upper connection pads 422, 424 and 426 via conductive vias, etc.

The semiconductor packages 100, 200 and 300 include a first semiconductor package 100, a second semiconductor package 200 and a third semiconductor package 300. In the present embodiment, the second and third semiconductor packages 200 and 300 can be located on the first semiconductor package 100 in a zigzag type in a manner such that their bump pads are exposed.

The first semiconductor package 100 includes a semiconductor chip 105, a first insulation layer pattern 120, redistribution patterns 130, dummy bump pads 131, and a second insulation layer pattern 140.

The semiconductor chip 105 of the first semiconductor package 100 has a data storage section (not shown) for storing data, a data processing section (not shown) for processing data, and one or more bonding pads 110 through which data is inputted and outputted. The respective bonding pads 110 are located, for example, on the center portion of one surface of the semiconductor chip 105. The respective bonding pads 110 are electrically connected with the data storage section and/or the data processing section of the semiconductor chip 105.

The first insulation layer pattern 120 is located on one surface of the semiconductor chip 105 on which the bonding pads 110 are formed. The first insulation layer pattern 120 has openings which expose the bonding pads 110.

The redistribution patterns 130 are located on the first insulation layer pattern 120. The first ends of the redistribution patterns 130 are electrically connected with the bonding pads 110, and the second ends of the redistribution patterns 130, which are opposite the first ends, extend in the shape of a line toward one edge of the semiconductor chip 105 on the first insulation layer pattern 120.

The dummy bump pads 131 are located on the first insulation layer pattern 120. The dummy bump pads 131 are formed on the first insulation layer pattern 120, for example, in the shape of an island. The dummy bump pads 131 are not electrically connected with the data storage section and/or the data processing section. For example, the dummy bump pads 131 are formed to have the number which corresponds to that of the redistribution patterns 130.

The second insulation layer pattern 140 is located on the first insulation layer pattern 120. The second insulation layer pattern 140 has openings which expose the dummy bump pads 131 and the ends of the redistribution patterns 130.

Hereinafter, the ends of the redistribution patterns 130, which are exposed through the second insulation layer pattern 140, will be referred to as bump pads 132.

The bump pads 132 which are defined by the second insulation layer pattern 140 and the dummy bump pads 131 are located to be symmetrical with respect to the bonding pads 110.

An adhesive member 150 is located on the other surface of the semiconductor chip 105 which faces away from the one surface on which the bonding pads 110 are formed. The adhesive member 150 may comprise a double-sided adhesive tape, an adhesive, and the like.

The bump pads 132 of the first semiconductor package 100 and the first connection pads 422, and the dummy bump pads 131 of the first semiconductor package 100 and the dummy connection pads 428 are electrically connected with each other by conductive balls 160.

Figure 5:
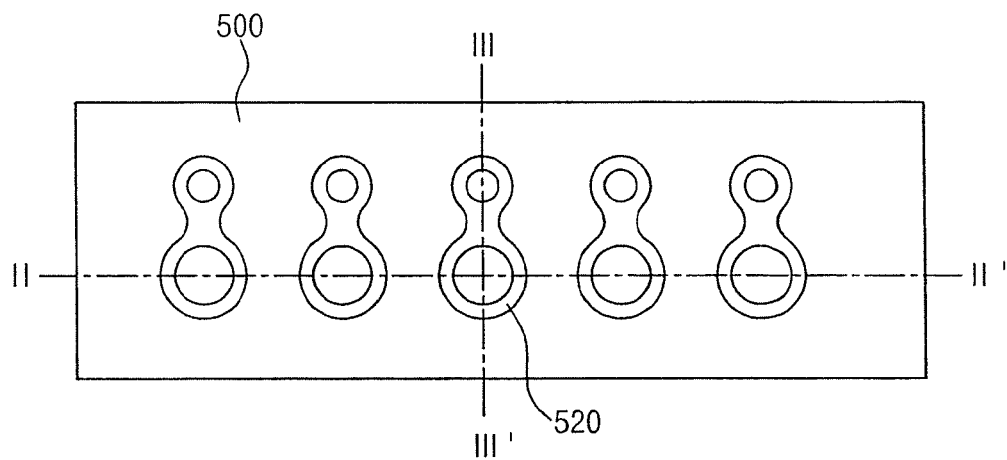
FIG. 5 is a plan view illustrating the first connection substrate shown in FIG. 4.
Figure 6:
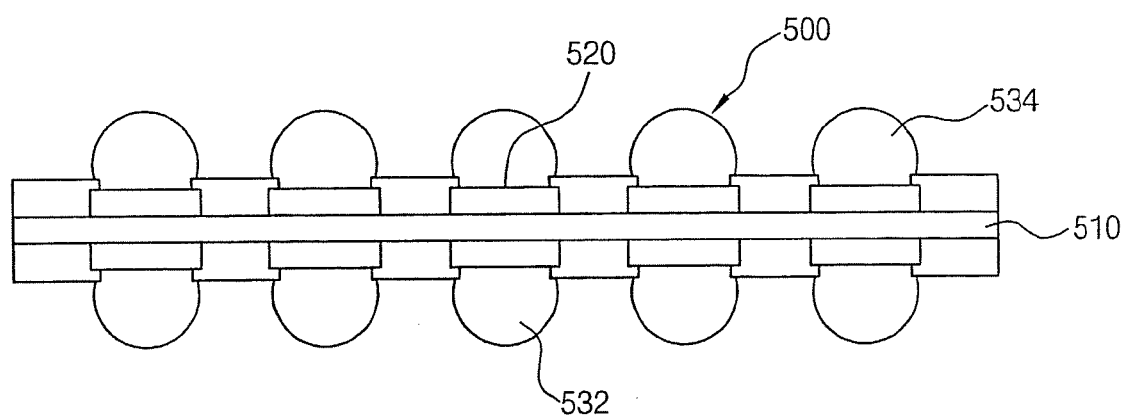
FIG. 6 is a cross-sectional view taken along the line II-II' of FIG. 5.
Figure 7:
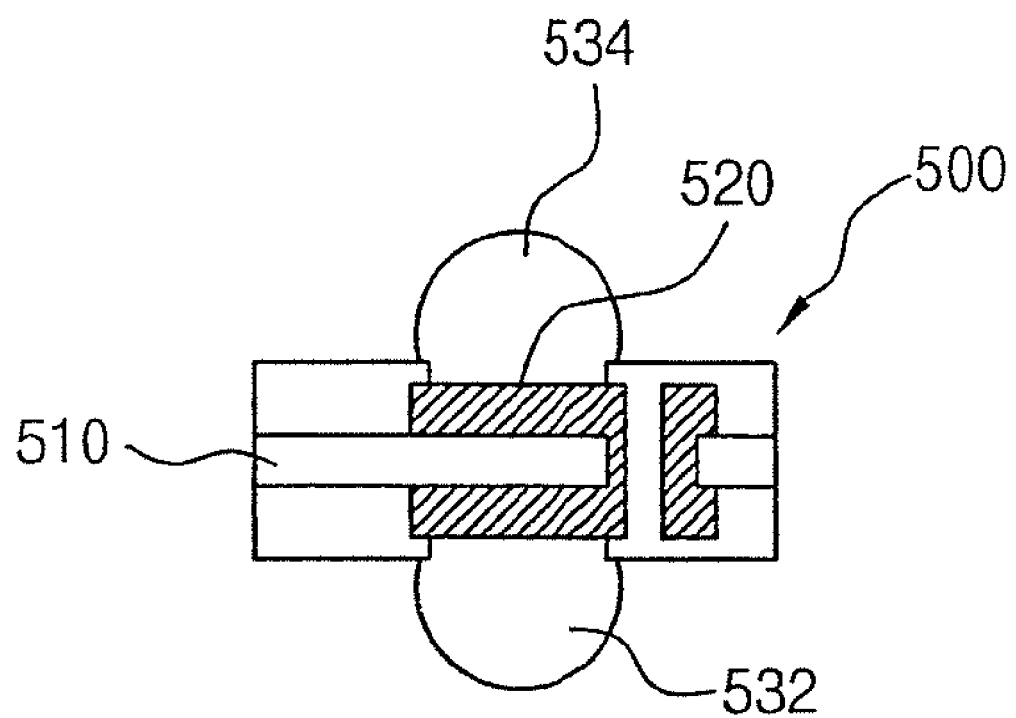
FIG. 7 is a cross-sectional view taken along the line III-III' of FIG. 5.

FIG. 5 is a plan view illustrating the first connection substrate shown in FIG. 4, FIG. 6 is a cross-sectional view taken along the line II-II' of FIG. 5, and FIG. 7 is a cross-sectional view taken along the line III-III' of FIG. 5.

Referring to FIGS. 4 through 7, the first connection substrate 500 is electrically connected to the second connection pads 424 of the substrate 400.

The first connection substrate 500 includes an insulation body 510 which has the shape of a plate, connection wirings 520 which are located to cover the upper and lower surfaces of the insulation body 510, and conductive balls 532 and 534 which are electrically connected to the lower and upper surfaces of the respective connection wirings 520.

In the present embodiment, conductive vias, which pass through the upper and lower surfaces of the insulation body 510, may be used in place of the connection wirings 520.

Referring to FIG. 4, the conductive balls 532, which are located on the lower surface of the connection wirings 520 of the first connection substrate 500, are electrically connected with the second connection pads 424 of the substrate 400. In the present embodiment, it is preferred that the thickness of the first connection substrate 500 be no greater than the thickness of the first semiconductor package 100.

In the meanwhile, the second connection substrate 550 is electrically connected to the third connection pads 426 of the substrate 400.

The second connection substrate 550 includes an insulation body 560 which has the shape of a plate, connection wirings 570 which are located to cover the upper and lower surfaces of the insulation body 560, and conductive balls 572 and 574 which are electrically connected to the lower and upper surfaces of the respective connection wirings 570. In the present embodiment, conductive vias, which pass through the upper and lower surfaces of the insulation body 560, may be used instead of the connection wirings 570.

The conductive balls 572, which are located on the lower surface of the connection wirings 560 of the second connection substrate 550, are electrically connected with the third connection pads 426 of the substrate 400. In the present embodiment, it is preferred that the thickness of the second connection substrate 550 be no less than the thickness of the first semiconductor package 100.

In the present embodiment, the second connection substrate 550 can be formed as a single element. Alternatively, the second connection substrate 550 can be formed by stacking at least two first connection substrates 500.

Referring to FIG. 4, the second semiconductor package 200 includes a semiconductor chip 205, a first insulation layer pattern 220, redistribution patterns 230, dummy bump pads 231, and a second insulation layer pattern 240.

The semiconductor chip 205 of the second semiconductor package 200 has a data storage section (not shown) for storing data, a data processing section (not shown) for processing data, and one or more bonding pads 210 through which data is inputted and outputted. The respective bonding pads 210 are located, for example, on the center portion of one surface of the semiconductor chip 205. The respective bonding pads 210 are electrically connected with the data storage section and/or the data processing section of the semiconductor chip 205.

The first insulation layer pattern 220 is located on one surface of the semiconductor chip 205 on which the bonding pads 210 are formed. The first insulation layer pattern 220 has openings which expose the bonding pads 210.

The redistribution patterns 230 are located on the first insulation layer pattern 220. The first ends of the redistribution patterns 230 are electrically connected with the bonding pads 210, and the second ends of the redistribution patterns 230 extend in the shape of a line toward one edge of the semiconductor chip 205 on the first insulation layer pattern 220.

The dummy bump pads 231 are located on the first insulation layer pattern 220. The dummy bump pads 231 are formed on the first insulation layer pattern 220, for example, in the shape of an island. The dummy bump pads 231 are not electrically connected with the data storage section and/or the data processing section. For example, the dummy bump pads 231 are formed to have the number which corresponds to that of the redistribution patterns 230.

The second insulation layer pattern 240 is located on the first insulation layer pattern 220. The second insulation layer pattern 240 has openings which expose the dummy bump pads 231 and the ends of the redistribution patterns 230. Hereinafter, the ends of the redistribution patterns 230, which are exposed through the second insulation layer pattern 240, will be referred to as bump pads 232.

The bump pads 232 which are defined by the second insulation layer pattern 240 and the dummy bump pads 231 are located to be symmetrical with respect to the bonding pads 210.

An adhesive member 250 is located on the other surface of the semiconductor chip 205 of the second semiconductor package 200 which faces away from the one surface on which the bonding pads 210 are formed. The adhesive member 250 may comprise a double-sided adhesive tape, an adhesive, and the like.

In the present embodiment, the second insulation layer pattern 240 of the second semiconductor package 200 is attached to the adhesive member 150 of the first semiconductor package 100. At this time, the second semiconductor package 200 is located to be deviated from the first semiconductor package 100 such that the bump pads 232 of the second semiconductor package 200 are exposed.

The bump pads 232 of the second semiconductor package 200 described above are electrically connected with the conductive balls 534 which are located on the upper surfaces of the connection wirings 520 of the first connection substrate 500.

Referring to FIG. 4, the third semiconductor package 300 includes a semiconductor chip 305, a first insulation layer pattern 320, redistribution patterns 330, dummy bump pads 331, and a second insulation layer pattern 340.

The semiconductor chip 305 of the third semiconductor package 300 has a data storage section (not shown) for storing data, a data processing section (not shown) for processing data, and one or more bonding pads 310 through which data is inputted and outputted. The respective bonding pads 310 are located, for example, on the center portion of one surface of the semiconductor chip 305. The respective bonding pads 310 are electrically connected with the data storage section and/or the data processing section of the semiconductor chip 305.

The first insulation layer pattern 320 is located on one surface of the semiconductor chip 305 on which the bonding pads 310 are formed. The first insulation layer pattern 320 has openings which expose the bonding pads 310.

The redistribution patterns 330 are located on the first insulation layer pattern 320. The first ends of the redistribution patterns 330 are electrically connected with the bonding pads 310, and the second ends of the redistribution patterns 330 extend in the shape of a line toward one edge of the semiconductor chip 305 on the first insulation layer pattern 320.

The dummy bump pads 331 are located on the first insulation layer pattern 320. The dummy bump pads 331 are formed on the first insulation layer pattern 320, for example, in the shape of an island. The dummy bump pads 331 are not electrically connected with the data storage section and/or the data processing section. For example, the dummy bump pads 331 are formed to have the number which corresponds to that of the redistribution patterns 330.

The second insulation layer pattern 340 is located on the first insulation layer pattern 320. The second insulation layer pattern 340 has openings which expose the dummy bump pads 331 and the ends of the redistribution patterns 330. Hereinafter, the ends of the redistribution patterns 330, which are exposed through the second insulation layer pattern 340, will be referred to as bump pads 332.

The bump pads 332 which are defined by the second insulation layer pattern 340 and the dummy bump pads 331 are located to be symmetrical with respect to the bonding pads 310.

An adhesive member 350 is located on the other surface of the semiconductor chip 305 of the second semiconductor package 300 which faces away from the one surface on which the bonding pads 310 are formed. The adhesive member 350 may comprise a double-sided adhesive tape, an adhesive, and the like.

In the present embodiment, the second insulation layer pattern 340 of the third semiconductor package 300 is attached to the adhesive member 250 of the second semiconductor package 200. At this time, the third semiconductor package 300 is located to be deviated from the second semiconductor package 200 such that the bump pads 332 of the third semiconductor package 300 are exposed.

The bump pads 332 of the third semiconductor package 300 described above are electrically connected with the conductive balls 574 which are located on the upper surfaces of the connection wirings 570 of the second connection substrate 550.

The molding member 600 covers the substrate 400, the first through third semiconductor packages 100, 200 and 300, the first connection substrate 500, and the second connection substrate 550 so that the first through third semiconductor packages 100, 200 and 300 are prevented from being broken by external shocks and/or vibrations.

As is apparent from the above description, in an embodiment of the present invention, after the bonding pads of at least two semiconductor chips are redistributed, the respective semiconductor chips are located in a face-down type, and a substrate with the respective semiconductor chips are electrically connected to each other using connection substrates. Therefore, problems caused by the use of conductive wires that have different lengths are solved by the present invention.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip having bonding pads located at a center portion thereof on a first surface of the semiconductor chip;
   a plurality of redistribution patterns extending from the bonding pads towards a first edge of the semiconductor chip and having bump pads disposed along the first edge of the semiconductor chip; and
   dummy bump pads disposed along a second edge of the semiconductor chip opposite the first edge,
   wherein pads disposed along the second edge of the semiconductor chip comprise only dummy bump pads, and pads disposed along the first edge of the semiconductor chip comprise only bump pads.

2. The semiconductor package according to claim 1, wherein the redistribution patterns have the shape of a line when viewed from the top, and the dummy bump pads have the shape of an island when viewed from the top.

3. The semiconductor package according to claim 1, wherein a first insulation layer pattern is interposed between the semiconductor chip and the redistribution patterns in such a way as to expose the bonding pads.

4. The semiconductor package according to claim 3, wherein a second insulation layer pattern is located on the first insulation layer pattern and exposes the dummy bump pads and ends of the redistribution patterns to define bump pads.

5. The semiconductor package according to claim 4, wherein a plurality of conductive balls are selectively connected to the bump pads.

6. The semiconductor package according to claim 4, wherein a plurality of conductive balls are connected to the dummy bump pads and the bump pads.

7. The semiconductor package according to claim 4, wherein the dummy bump pads and the bump pads are located to be symmetrical with respect to the bonding pads.

8. The semiconductor package according to claim 1, wherein an adhesive member is located on a second surface of the semiconductor chip which faces opposite the first surface of the semiconductor chip on which the bonding pads are formed.

9. A multi-chip semiconductor package comprising:
   first, second and third semiconductor packages each including a semiconductor chip having bonding pads located at a center portion thereof, redistribution patterns extending from the bonding pads towards a first edge of the semiconductor chip and having bump pads on ends thereof, and dummy bump pads located adjacent to a second edge of the semiconductor chip opposite the first edge;

a substrate having a plurality of first connection pads which are electrically connected with the bump pads and the first connection pads which are physically connected with the dummy bump pads of the first semiconductor package;

a first connection substrate electrically connecting the bump pads of the second semiconductor package located on the first semiconductor package with second connection pads of the substrate; and a second connection substrate electrically connecting the bump pads of the third semiconductor package located on the second semiconductor package with third connection pads of the substrate.

10. The multi-chip semiconductor package according to claim 9, wherein adhesive members are respectively interposed between the first through third semiconductor packages.

11. The multi-chip semiconductor package according to claim 9, wherein the bump pads and the first connection pads of the substrate are electrically connected with each other by way of conductive balls, and the dummy bump pads and the first connection pads are physically connected with each other by way of conductive balls.

12. The multi-chip semiconductor package according to claim 9, wherein the first connection substrate comprises:
   an insulation body having an upper surface and a lower surface;
   a plurality of connection wirings for electrically connecting the upper and lower surfaces of the insulation body; and
   a plurality of conductive balls connected to at least one of upper and lower surfaces of the respective connection wirings.

13. The multi-chip semiconductor package according to claim 9, wherein the second connection substrate comprises:
   an insulation body having an upper surface and a lower surface;
   a plurality of connection wirings for electrically connecting the upper and lower surfaces of the insulation body; and
   a plurality of conductive balls connected to at least one of upper and lower surfaces of the respective connection wirings.

14. The multi-chip semiconductor package according to claim 13, wherein the thickness of the second connection substrate is greater than that of the first connection substrate.

15. The multi-chip semiconductor package according to claim 13, wherein the thickness of the second connection substrate is the same as that of the first connection substrate, and at least two connection substrates are stacked between the substrate and the third semiconductor package.

16. The multi-chip semiconductor package according to claim 9, wherein the second and third semiconductor packages are located on the first semiconductor package in a zigzag type such that the bump pads of the second and third semiconductor packages are exposed beyond the first semiconductor package.

* * * * *